United States Patent
Kawahara et al.

(10) Patent No.: US 12,379,423 B2
(45) Date of Patent: Aug. 5, 2025

(54) BATTERY DEGRADATION ESTIMATION DEVICE, BATTERY DEGRADATION ESTIMATION SYSTEM, BATTERY DEGRADATION ESTIMATION METHOD, AND STORAGE MEDIUM

(71) Applicant: HONDA MOTOR CO., LTD., Tokyo (JP)

(72) Inventors: Takuma Kawahara, Wako (JP); Shunsuke Konishi, Wako (JP); Hidetoshi Utsumi, Wako (JP); Koji Sato, Tokyo (JP)

(73) Assignee: HONDA MOTOR CO., LTD., Tokyo (JP)

( * ) Notice: Subject to any disclaimer, the term of this patent is extended or adjusted under 35 U.S.C. 154(b) by 393 days.

(21) Appl. No.: 17/947,213

(22) Filed: Sep. 19, 2022

(65) Prior Publication Data

US 2023/0096267 A1    Mar. 30, 2023

(30) Foreign Application Priority Data

Sep. 30, 2021 (JP) ................. 2021-161425

(51) Int. Cl.
*G01R 31/392* (2019.01)
*G01R 31/367* (2019.01)
(Continued)

(52) U.S. Cl.
CPC ......... *G01R 31/392* (2019.01); *G01R 31/367* (2019.01); *G01R 31/3842* (2019.01); *G01R 31/396* (2019.01)

(58) Field of Classification Search
None
See application file for complete search history.

(56) References Cited

U.S. PATENT DOCUMENTS

2017/0363690 A1* 12/2017 Kawamura ........ G01R 31/3648
2021/0033680 A1   2/2021 Ukumori
(Continued)

FOREIGN PATENT DOCUMENTS

| CN | 112731159 | 4/2021 |
| EP | 3916884 | 12/2021 |

(Continued)

OTHER PUBLICATIONS

Khumprom, P.; Yodo, N. A Data-Driven Predictive Prognostic Model for Lithium-ion Batteries based on a Deep Learning Algorithm. Energies 2019, 12, 660. https://doi.org/10.3390/en12040660 (Year: 2019).*

(Continued)

*Primary Examiner* — Matthew G Marini
(74) *Attorney, Agent, or Firm* — Amin, Turocy & Watson, LLP (57) ABSTRACT

Provided is a battery degradation estimation device including a storage medium that stores computer-readable instructions, and a processor coupled to the storage medium, the processor executing the computer-readable instructions to: acquire time-series data including at least a voltage, SOC (State Of Charge), temperature, and current of a battery; convert the time-series data into intermediate data to be used for training; predict a future value of the intermediate data and a future value of an indicator relating to a degradation state of the battery by using a prediction function to generate training data; train a prediction model for estimating the indicator relating to the degradation state of the battery on the basis of the training data; and estimate the indicator relating to the degradation state of the battery on the basis of the prediction model.

8 Claims, 9 Drawing Sheets

(51) Int. Cl.
*G01R 31/3842* (2019.01)
*G01R 31/396* (2019.01)

(56) References Cited

U.S. PATENT DOCUMENTS

| 2021/0048482 | A1 | 2/2021 | Ukumori |
| 2021/0132151 | A1 | 5/2021 | Lee et al. |
| 2021/0247459 | A1 | 8/2021 | Haga |
| 2023/0003809 | A1 | 1/2023 | Mizoguchi |

FOREIGN PATENT DOCUMENTS

| JP | 2015-059924 | 3/2015 |
| JP | 2019-168451 | 10/2019 |
| JP | 2019-168452 | 10/2019 |
| JP | 2019-168453 | 10/2019 |
| JP | 2020-119658 | 8/2020 |
| JP | 2021-092404 | 6/2021 |
| JP | 2021-124419 | 8/2021 |

OTHER PUBLICATIONS

J. Meng, D. -I. Stroe, M. Ricco, G. Luo and R. Teodorescu, "A Simplified Model-Based State-of-Charge Estimation Approach for Lithium-Ion Battery With Dynamic Linear Model, " in IEEE Transactions on Industrial Electronics, vol. 66, No. 10, pp. 7717-7727, Oct. 2019, doi: 10.1109/TIE.2018.2880668. (Year: 2019).*

Japanese Notice of Allowance for Japanese Patent Application No. 2021-161425 mailed Sep. 19, 2023.

Japanese Office Action for Japanese Patent Application No. 2021-161425 mailed Jun. 27, 2023,.

* cited by examiner

| RECORD | INDEPENDENT VARIABLE ||||||| DEPENDENT VARIABLE |
| | SOC || TEMPERATURE || CURRENT AMOUNT || |
| | FIRST INTEGRATED SOC PERIOD | ... | TENTH INTEGRATED SOC PERIOD | FIRST INTEGRATED TEMPERATURE PERIOD | ... | TENTH INTEGRATED TEMPERATURE PERIOD | INTEGRATED CHARGE CURRENT AMOUNT | INTEGRATED DISCHARGE CURRENT AMOUNT | SOH |
|---|---|---|---|---|---|---|---|---|---|
| 1 | ... | ... | ... | ... | ... | ... | ... | ... | ... |
| 2 | ... | ... | ... | ... | ... | ... | ... | ... | ... |
| 3 | ... | ... | ... | ... | ... | ... | ... | ... | ... |
| 4 | ... | ... | ... | ... | ... | ... | ... | ... | ... |

BATTERY DEGRADATION ESTIMATION DEVICE, BATTERY DEGRADATION ESTIMATION SYSTEM, BATTERY DEGRADATION ESTIMATION METHOD, AND STORAGE MEDIUM

CROSS-REFERENCE TO RELATED APPLICATION

The application is based on Japanese Patent Application No. 2021-161425 filed on Sep. 30, 2021, the content of which incorporated herein by reference.

BACKGROUND

Field of the Invention

The present invention relates to a battery degradation estimation device, a battery degradation estimation system, a battery degradation estimation method, and a storage medium.

Description of Related Art

Hitherto, the technology of estimating the degradation state (SOH: State Of Health) of a battery has been known. For example, Japanese Patent Application Laid-open No. 2019-168452 discloses a degradation estimation device including an SOH acquisition unit that acquires an SOH of a charge storage element at a first time point and an SOH of the charge storage element at a second time point subsequent to the first time point, a representative value acquisition unit that acquires a representative value of the SOC of the charge storage element between the first time point and the second time point, and a training processing unit that trains a training model on the basis of training data in which the SOH and representative value at the first time point serve as input data and the SOH at the second time point serves as output data.

The technology disclosed in Japanese Patent Application Laid-open No. 2019-168452 trains the training model for estimating the SOH by using training data in the range of a period in which the SOH has been acquired. The training model trained in this manner is generally expected to have a high estimation accuracy within the range in which the SOH has been acquired. However, the training data cannot necessarily be acquired for all the ranges of prediction, and the estimation accuracy of the training model deteriorates significantly in some cases outside of the range in which the SOH has been acquired. As a result, for example, there is a problem in that long term training data is required to be prepared to predict long term SOH, resulting in increase in cost.

SUMMARY

The present invention has been made in view of the above-mentioned circumstances, and has an object to provide a battery degradation estimation device, a battery degradation estimation system, a battery degradation estimation method, and a storage medium, which are capable of predicting long-term SOH without the need to prepare long-term training data.

A battery degradation estimation device, a battery degradation estimation system, a battery degradation estimation method, and a storage medium according to one embodiment of the present invention adopt the following configurations.

(1): According to one aspect of the present invention, there is provided a battery degradation estimation device including a storage medium that stores computer-readable instructions, and a processor coupled to the storage medium, the processor executing the computer-readable instructions to: acquire time-series data including at least a voltage, SOC (State Of Charge), temperature, and current of a battery; convert the time-series data into intermediate data to be used for training; predict a future value of the intermediate data and a future value of an indicator relating to a degradation state of the battery by using a prediction function to generate training data; train a prediction model for estimating the indicator relating to the degradation state of the battery on the basis of the training data; and estimate the indicator relating to the degradation state of the battery on the basis of the prediction model.

(2): In the aspect (1), the intermediate data includes, as an independent variable of the prediction model, at least one of: integrated voltage distribution information obtained by integrating a period in which the battery has exhibited a predetermined voltage value; integrated SOC distribution information obtained by integrating a period in which the battery has exhibited a predetermined SOC value; integrated temperature distribution information obtained by integrating a period in which the battery has exhibited a predetermined temperature value; an integrated charge current amount obtained by integrating a charge amount of the battery; and an integrated discharge current amount obtained by integrating a discharge amount of the battery, and the processor generate the training data by increasing a data amount of the at least one independent variable by using a linear function.

(3): In the aspect (2), a dependent variable of the prediction model is an indicator relating to the degradation state of the battery, and the processor generates the training data by increasing a data amount of the dependent variable using a function including exponentiation.

(4): In the aspect (3), the processor repeats steps of subjecting a measurement value of the dependent variable to exponentiation calculation while changing an exponent value of the function including exponentiation, training a battery model for estimating the measurement value of the dependent variable subjected to the exponentiation calculation with the intermediate data serving as an independent variable, and evaluating an output value of the trained battery model, to thereby search for an optimal exponent value of the function including exponentiation.

(5): In the aspect (2), the processor is capable of detecting the stopped state of a device using power in which the battery is mounted, and interpolates the time-series data of the device in the stopped state.

(6): According to another aspect of the present invention, there is provided a battery degradation estimation system including: a plurality of devices using power including: a battery; and a data provision unit that provides time-series data including at least one of a voltage, SOC (State Of Charge), temperature, and current of the battery; and a management device including: a data acquisition unit that acquires the time-series data from the data provision unit; a data conversion unit that converts the time-series data into intermediate data to be used for training; a training data generation unit that predicts a future value of the intermediate data and a future value of an indicator relating to a degradation state of the battery by using a prediction function to generate training data; a prediction model training unit that trains a prediction model for estimating the indicator relating to the degradation state of the battery on the basis of the training data; and a degradation state estimation unit that estimates the indicator relating to the degradation state of the battery on the basis of the prediction model.

(7): According to another aspect of the present invention, there is provided a battery degradation estimation method to be executed by a computer, the battery degradation estimation method including: acquiring time-series data including at least a voltage, SOC (State Of Charge), temperature, and current of a battery; converting the time-series data into intermediate data to be used for training; predicting a future value of the intermediate data and a future value of an indicator relating to a degradation state of the battery by using a prediction function to generate training data; training a prediction model for estimating the indicator relating to the degradation state of the battery on the basis of the training data; and estimating the indicator relating to the degradation state of the battery on the basis of the prediction model.

(8): According to another aspect of the present invention, there is provided a non-transitory computer-readable storage medium having stored thereon a program for causing a computer to: acquire time-series data including at least a voltage, SOC (State Of Charge), temperature, and current of a battery; convert the time-series data into intermediate data to be used for training; predict a future value of the intermediate data and a future value of an indicator relating to a degradation state of the battery by using a prediction function to generate training data; train a prediction model for estimating the indicator relating to the degradation state of the battery on the basis of the training data; and estimate the indicator relating to the degradation state of the battery on the basis of the prediction model.

According to the aspects (1) to (8), it is possible to predict long-term SOH without the need to prepare long-term training data.

According to the aspect (2) or (3), it is possible to create a prediction model that predicts long-term SOH accurately while suppressing the data collection cost by increasing the amount of the independent variable or the dependent variable.

According to the aspect (4), it is possible to improve the accuracy of the prediction model by searching for an optimal exponent value that depends on the characteristics of an individual battery.

According to the aspect (5), it is possible to create a prediction model that predicts long-term SOH accurately while suppressing the data collection cost by interpolating the data of a device in a stopped state.

DESCRIPTION OF EMBODIMENTS

Now, a battery degradation estimation device, a battery degradation estimation system, a battery degradation estimation method, and a storage medium according to an embodiment of the present invention are described with reference to the drawings.

[Vehicle Configuration]

Figure 1:
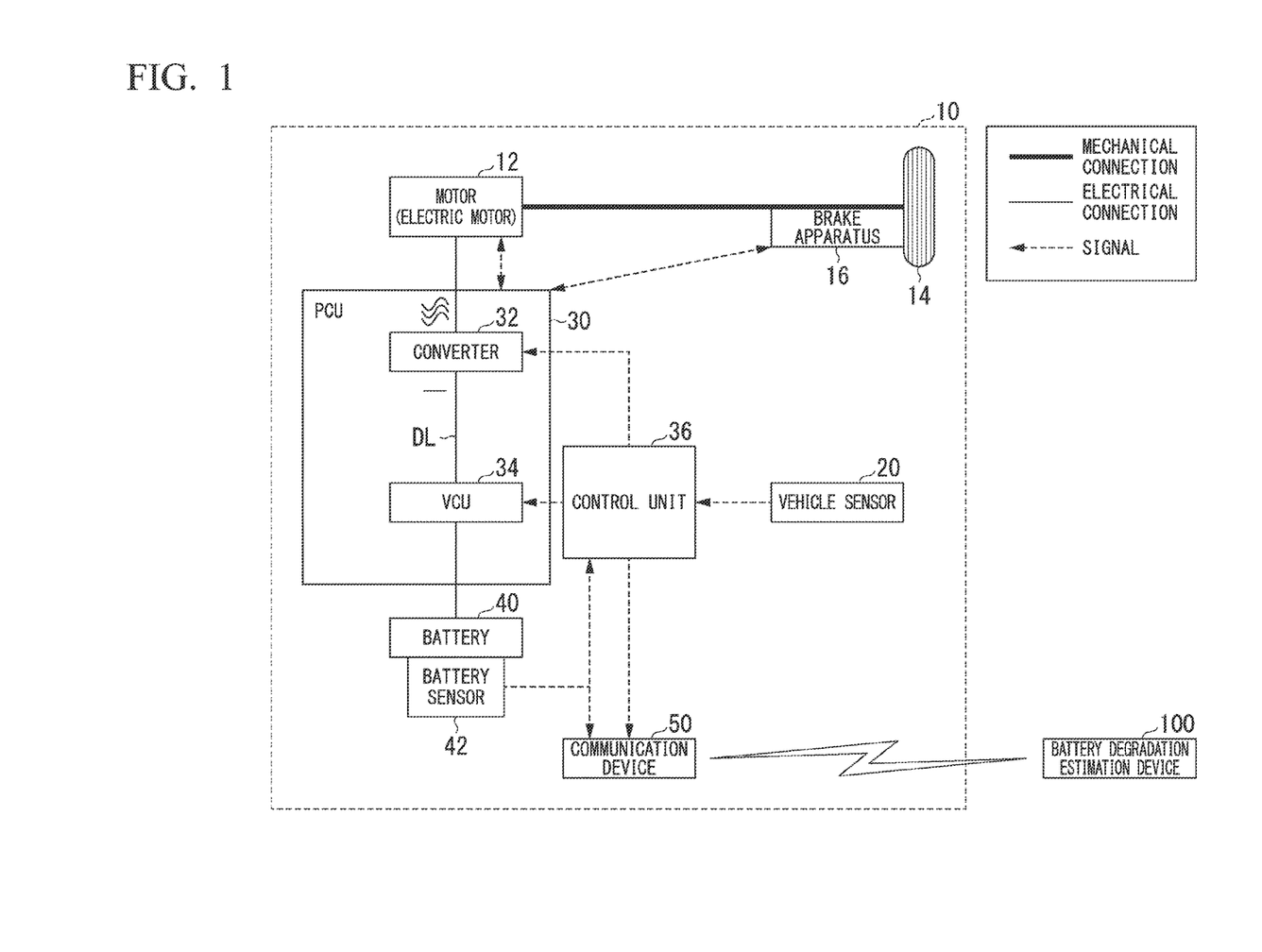
FIG. 1 is a diagram illustrating an exemplary configuration of a vehicle to which a battery degradation estimation device according to an embodiment is applied.

FIG. 1 is a diagram illustrating an exemplary configuration of a vehicle 10 to which a battery degradation estimation device 100 according to an embodiment is applied. The vehicle 10 illustrated in FIG. 1 is a battery electric vehicle (BEV) traveling using a motor (electric motor) driven by power supplied from a battery (secondary battery) for traveling. Alternatively, the vehicle 10 may be a plug-in hybrid vehicle (PHV) or a plug-in hybrid electric vehicle (PHEV), which is a hybrid vehicle having an external charging function. The vehicle 10 includes, for example, not only a four-wheeled vehicle, but also a saddle-riding two-wheeled vehicle, a three-wheeled vehicle (including a vehicle with two front wheels and one rear wheel in addition to one front wheel and two rear wheels), an assisted bicycle, and even an electric boat. The vehicle 10 includes any other mobile object that travels using an electric motor driven by power supplied from a battery. The vehicle 10 includes any other mobile object that travels using an electric motor driven by power supplied from a battery.

A motor 12 is, for example, a three-phase AC motor. The rotor of the motor 12 is connected to a driven wheel 14. The motor 12 is driven by power supplied from an accumulation unit (not shown) included in a battery 40, and transmits the rotational force to the driven wheel 14. Further, the motor 12 generates power using kinetic energy of the vehicle 10 at the time of deceleration of the vehicle 10.

A brake apparatus 16 includes, for example, a brake caliper, a cylinder that transmits hydraulic pressure to the brake caliper, and an electric motor that generates hydraulic pressure in the cylinder. The brake apparatus 16 may be equipped with a mechanism as a backup, which transmits the hydraulic pressure generated by the operation by the user (driver) of the vehicle 10 against a brake pedal (not shown) to the cylinder via the master cylinder. The brake apparatus 16 is not limited to the configuration described above, but may be an electronically controlled hydraulic brake apparatus that transmits the hydraulic pressure from the master cylinder to the cylinder.

A vehicle sensor 20 includes, for example, an accelerator position sensor, a vehicle speed sensor, and a brake depression amount sensor. The accelerator position sensor is attached to the accelerator pedal, detects the amount of operation of the accelerator pedal by the driver, and outputs the detected amount of operation as the accelerator position to a control unit 36 included in a PCU 30 described later. The vehicle speed sensor includes, for example, a wheel speed sensor attached to each wheel of the vehicle 10 and a speed calculator, which integrates the wheel speeds detected by the wheel speed sensors to derive the speed (vehicle speed) of the vehicle 10 for output to the control unit 36. A brake depression amount sensor is attached to the brake pedal, and detects the amount of operation of the brake pedal by the driver, and outputs the detected amount of operation to the control unit 36 as a brake depression amount.

The PCU 30 includes, for example, a converter 32 and a voltage control unit (VCU) 34, and the control unit 36. In FIG. 1, these components in the vehicle 10 are shown in a single component as the PCU 30 as an example, and may be arranged in a distributed manner.

The converter 32 is, for example, an AC-DC converter. The terminal of the converter 32 on the direct current side is connected to a direct current link DL. The direct current link DL is connected to the battery 40 via the VCU 34. The converter 32 converts alternating current generated by the motor 12 to direct current, and outputs the direct current to the direct current link DL.

The VCU 34 is, for example, a DC-DC converter. The VCU 34 increases the voltage of power supplied from the battery 40, and outputs the power to the direct current link DL.

The control unit 36 controls drive of the motor 12 on the basis of output from the accelerator position sensor included in the vehicle sensor 20. The control unit 36 controls the brake apparatus 16 on the basis of output from the brake depression amount sensor included in the vehicle sensor 20. The control unit 36 calculates, for example, an SOC (State Of Charge) of the battery 40 on the basis of output from a battery sensor 42 described later, which is connected to the battery 40, and outputs the SOC to the VCU 34. The VCU 34 increases the voltage of the direct current link DL in response to an instruction from the control unit 36.

The battery 40 is a secondary battery capable of repeatedly charging and discharging, such as a lithium ion battery. The positive electrode active material forming the positive electrode of the battery 40 is, for example, a material containing at least one material among nickel cobalt manganese (NCM), nickel cobalt aluminum (NCA), lithium ferrophosphate (LFP), and lithium manganese oxide (LMO), and the negative electrode active material forming the negative electrode of the battery 40 is, for example, a material containing at least one material among hard carbon and graphite. Further, the battery 40 may be, for example, a cassette type battery pack, which is removably attached to the vehicle tenth battery 40 stores power supplied from a charger (not shown) outside of the vehicle 10, and discharges power for traveling of the vehicle 10.

The battery sensor 42 detects a physical quantity such as current, voltage, and temperature of the battery 40. The battery sensor 42 includes, for example, a current sensor, a voltage sensor, and a temperature sensor. The battery sensor 42 detects a current of the secondary battery constructing the battery 40 (hereinafter simply referred to as "battery 40") by using the current sensor, detects a voltage of the battery 40 by using the voltage sensor, and detects a temperature of the battery 40 by using the temperature sensor. The battery sensor 42 outputs data of the physical quantity such as detected current value, voltage value, and temperature of the battery 40 to the control unit 36 or a communication device 50.

The communication device 50 includes a wireless module for connecting to a cellular network or a Wi-Fi network. The communication device 50 may also include a wireless module for using Bluetooth (trademark) or the like. The communication device 50 transmits/receives various kinds of information on the vehicle 10 to/from, for example, the battery characteristic estimation device 100 through communication using the wireless module. The communication device 50 transmits the data of the physical quantity of the battery 40, which is output from the control unit 36 or the battery sensor 42, to the battery characteristic estimation device 100. The communication device 50 may receive information indicating the characteristic of the battery 40, which has been diagnosed and transmitted by the battery characteristic estimation device 100 described later, and output the received information indicating the characteristic of the battery 40 to an HMI (not shown) of the vehicle 10.

[Configuration of Battery Degradation Estimation Device]

Figure 2:
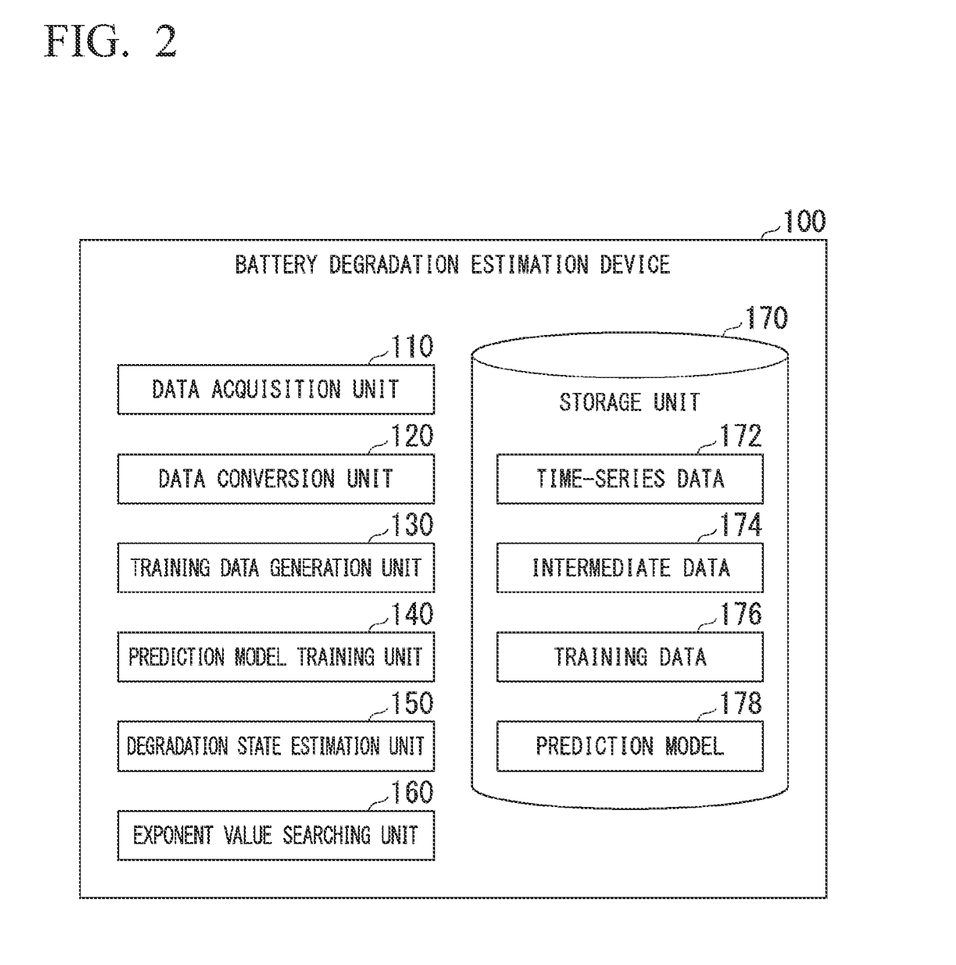
FIG. 2 is a diagram illustrating an example of a configuration of the battery degradation estimation device according to an embodiment.

Next, description is given of an example of the battery characteristic estimation device 100 estimating the characteristic of the battery 40 of the vehicle 10. FIG. 2 is a diagram illustrating an exemplary configuration of the battery characteristic estimation device 100 according to an embodiment. The battery characteristic estimation device 100 includes, for example, a data acquisition unit 110, a data conversion unit 120, a training data generation unit 130, a prediction model training unit 140, a degradation state estimation unit 150, and an exponent value searching unit 160. data acquisition unit 1 tenth data conversion unit 120, the training data generation unit 130, the prediction model training unit 140, the degradation state estimation unit 150, and the exponent value searching unit 160 are implemented by a hardware processor such as a CPU (Central Processing Unit) executing a program (software), for example. A part or all of these components may be implemented by hardware (circuit unit including circuitry) such as an LSI (Large Scale Integration), an ASIC (Application Specific Integrated Circuit), an FPGA (Field-Programmable Gate Array), or a GPU (Graphics Processing Unit), or may be implemented through cooperation between software and hardware. The program may be stored in a storage device (storage device including non-transitory storage medium) such as an HDD (Hard Disk Drive) or flash memory in advance, or may be stored in a removable storage medium (non-transitory storage medium) such as a DVD or CD-ROM and the storage medium may be attached to a drive device to install the program. The storage unit 170 is, for example, an HDD, a flash memory, or a random access memory (RAM). The storage unit 170 stores, for example, time-series data 172, intermediate data 174, training data 176, and a prediction model 178.

The data acquisition unit 110 uses a communication interface (not shown) mounted on the battery characteristic estimation device 100 to acquire time-series data such as an SOC, a temperature, and a current value of the battery 40 from the communication device 50, and store the time-series data into the storage unit 170 as time-series data 172. In this case, the data acquisition unit 110 may execute the processing of excluding abnormal data or partially lost data from the acquired time-series data.

The data acquisition unit 110 also acquires information indicating whether the vehicle 10 is in a driving state or a stopped state from the communication device 50 as the time-series data 172. For example, the data acquisition unit 110 acquires information indicating the ON/OFF state of the main relay of the vehicle 10, which is detected by the vehicle 20, to thereby be able to grasp whether the vehicle 10 is in a driving state or a stopped state.

In general, when the vehicle 10 is in a stopped state, the battery sensor 42 is also in a stopped state, and thus the data acquisition unit 110 cannot acquire the time-series data 172 in a period in which the vehicle 10 is in a stopped state. As a result, it is expected that training data to be used for machine learning becomes insufficient, and the accuracy of the prediction model to be trained deteriorates. In view of this, in this embodiment, the data acquisition unit 110 generates the time-series data 172 in the period in which the vehicle 10 is in a stopped state through interpolation using the time-series data 172 in the period in which the vehicle 10 is a driving state.

Figure 3:
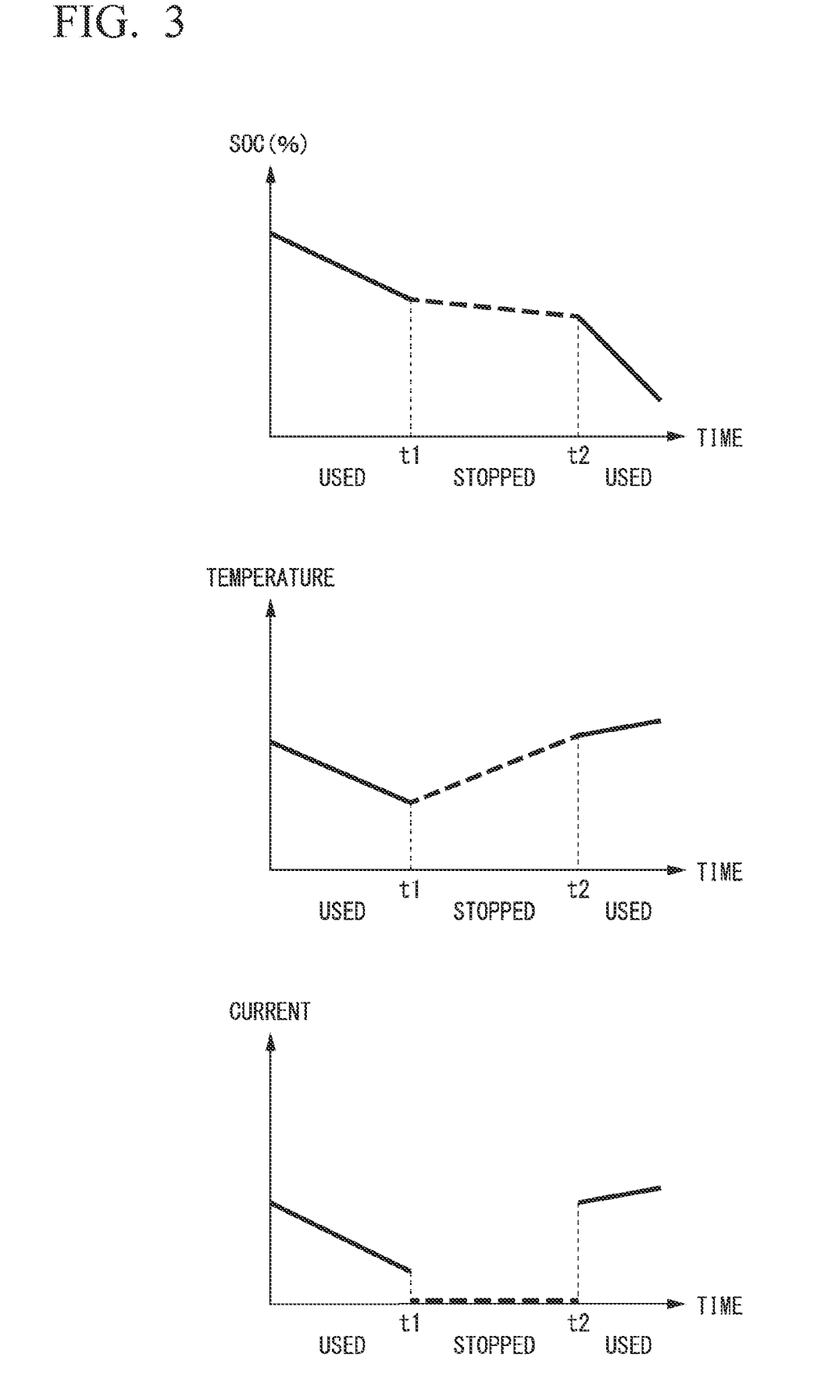
FIG. 3 is a diagram illustrating an example of a method of interpolating time-series data in a period in which the vehicle is in a stopped state.

FIG. 3 is a diagram illustrating an example of a method of interpolating the time-series data 172 in the period in which the vehicle 10 is in a stopped state. The graph in the upper part of FIG. 3 shows a method of interpolating the time-series data 172 of the SOC in the period in which the vehicle 10 is in a stopped state, the graph in the center part of FIG. 3 shows a method of interpolating the time-series data 172 of the temperature in the period in which the vehicle 10 is in a stopped state, and the graph in the lower part of FIG. 3 shows a method of interpolating the time-series data 172 of the current in the period in which the vehicle 10 is in a stopped state.

As illustrated in FIG. 3, it is assumed that the data acquisition unit 110 has acquired information indicating that the vehicle 10 is in a stopped state at a time point t1, and has acquired information indicating that the vehicle 10 is in a driving state at a time point t2. In this case, the battery sensor 42 is in a stopped state in a period between the time point t1 and the time point t2, and as a result, the data acquisition unit 110 cannot acquire the time-series data 172 in this period. Thus, the data acquisition unit 110 interpolates the time-series data 172 of the SOC, temperature, and current value of the battery 40 in the period between the time point t1 and the time point t2.

Specifically, as illustrated in the graph in the left part of FIG. 3, the data acquisition unit 110 linearly interpolates the value of the SOC at the time point t1 and the value of the SOC at the time point t2 to interpolate the time-series data 172 of the SOC of the battery 40 in the period between the time point t1 and the time point t2. Further, as illustrated in the graph in the center part of FIG. 3, the data acquisition unit 110 linearly interpolates the value of the temperature at the time point t1 and the value of the temperature at the time point t2 to interpolate the time-series data 172 of the temperature of the battery 40 in the period between the time point t1 and the time point t2. Further, as illustrated in the graph in the right part of FIG. 3, the data acquisition unit 110 sets the current value of the battery 40 in the period between the time point t1 and the time point t2 to interpolate the time-series data 172 of the current of the battery 40 in this period. This is because contrary to the SOC or temperature, when the vehicle 10 is stopped, the acquired current value becomes substantially zero. Although FIG. 3 shows, as an example, the use of linear interpolation as an interpolation method for the time-series data 172, the invention is not limited to such a configuration. For example, any interpolation method such as Lagrangian or spline interpolation may be used.

Figure 4:
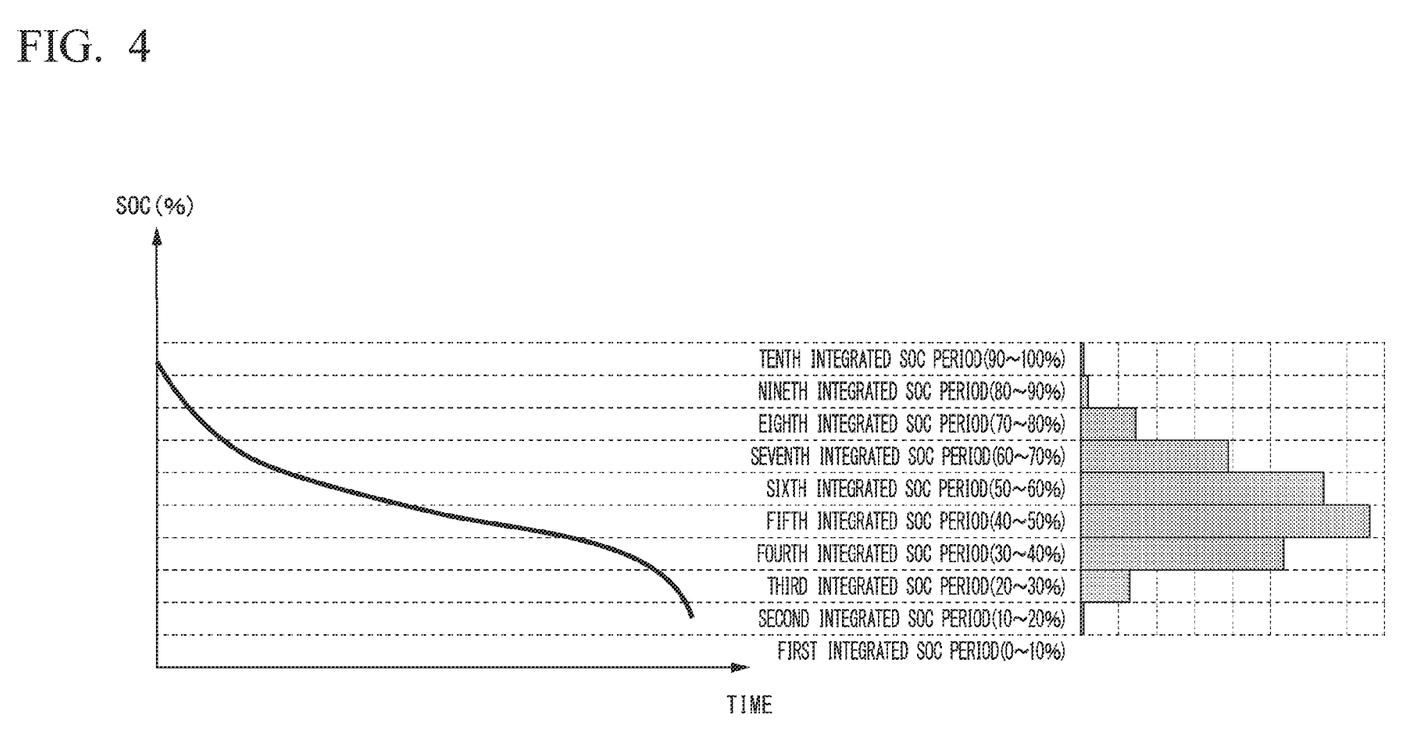
FIG. 4 is a diagram illustrating an example of a method of converting time-series data of the SOC of a battery into intermediate data.

The data conversion unit 120 converts the time-series data 172 stored in the storage unit 170 to the intermediate data 174 to be used for training, and stores the intermediate data 174 into the storage unit 170. FIG. 4 is a diagram illustrating an example of a method of converting the time-series data 172 of the SOC of the battery 40 into the intermediate data 174. The data conversion unit 120 uses the time-series data 172 of the SOC of the battery 40 to integrate a period in which the SOC falls within a predetermined range, and calculates the integrated SOC period corresponding to the range as the intermediate data 174. Specifically, in FIG. 4, the first integrated SOC period is an integrated value of a period in which the SOC of the battery 40 falls within the range of 0 to 10 [%], the second integrated SOC period is an integrated value of a period in which the SOC of the battery 40 falls within the range of 10 to 20 [%], the third integrated SOC period is an integrated value of a period in which the SOC of the battery 40 falls within the range of 20 to 30 [%], the fourth integrated SOC period is an integrated value of a period in which the SOC of the battery 40 falls within the range of 30 to 40 [%], the fifth integrated SOC period is an integrated value of a period in which the SOC of the battery 40 falls within the range of 40 to 50 [%], the sixth integrated SOC period is an integrated value of a period in which the SOC of the battery 40 falls within the range of 50 to 60 [%], the seventh integrated SOC period is an integrated value of a period in which the SOC of the battery 40 falls within the range of 60 to 70 [%], the eighth integrated SOC period is an integrated value of a period in which the SOC of the battery 40 falls within the range of 70 to 80 [%], the ninth integrated SOC period is an integrated value of a period in which the SOC of the battery 40 falls within the range of 80 to 90 [%], and the tenth integrated SOC period is an integrated value of a period in which the SOC of the battery 40 falls within the range of 90 to 100 [%]. That is, the first integrated SOC period to the tenth integrated SOC period correspond to the intermediate data 174 of the SOC of the battery 40. As an example, FIG. 4 shows an example where SOC ranges are set at 10% intervals, but the present invention is not limited to this configuration, and SOC ranges may be set at any interval.

Figure 5:
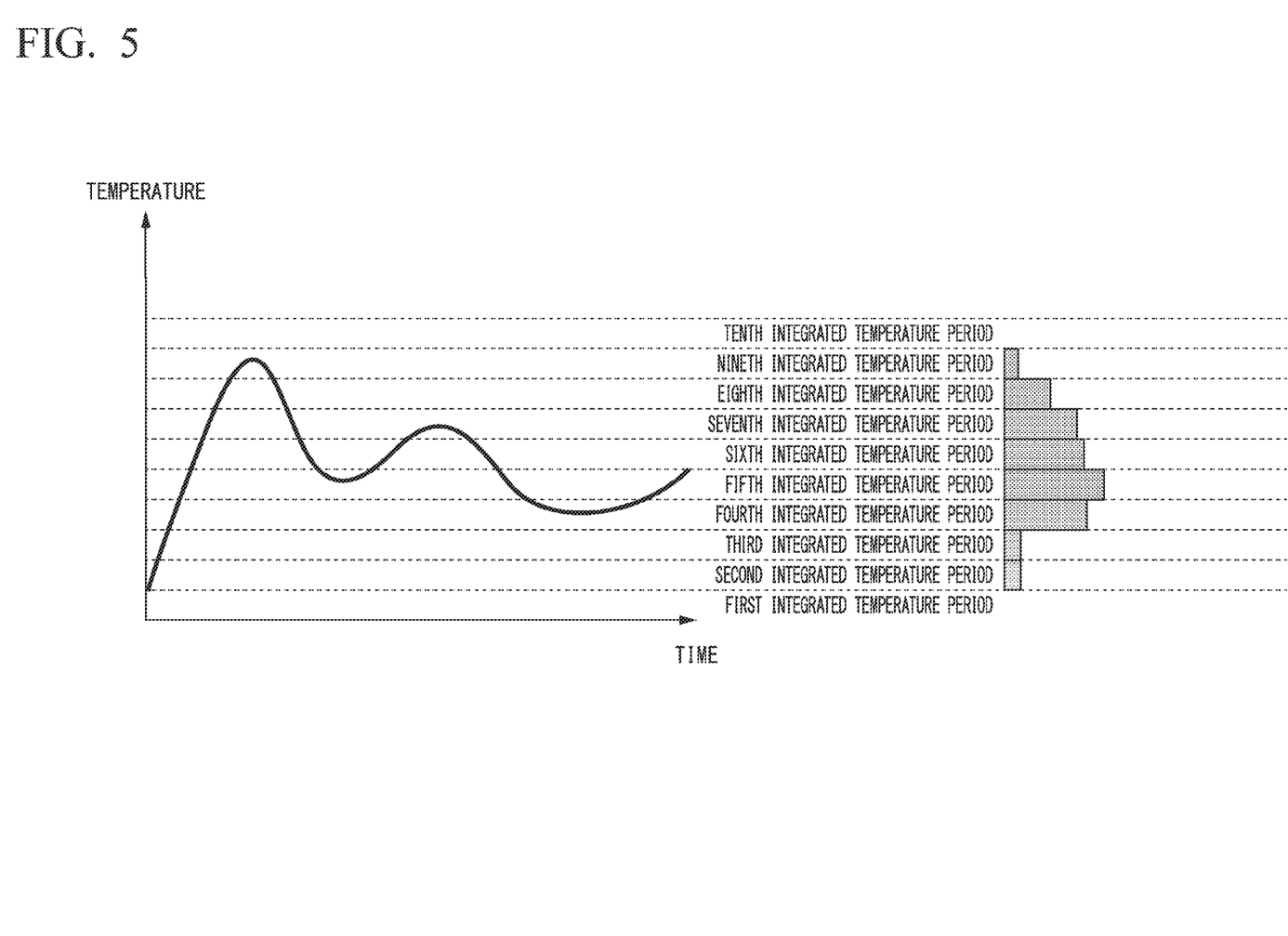
FIG. 5 is a diagram illustrating an example of a method of converting time-series data of the temperature of the battery into intermediate data.

FIG. 5 is a diagram illustrating an example of a method of converting time-series data 172 of the temperature of the battery 40 into the intermediate data 174. The data conversion unit 120 uses the time-series data 172 of the temperature of the battery 40 to integrate a period in which the temperature falls within a predetermined range, and calculates the integrated temperature period corresponding to the range as the intermediate data 174. Specifically, in FIG. 5, the first integrated temperature period is an integrated value of a period in which the temperature of the battery 40 falls within a first temperature range, the second integrated temperature period is an integrated value of a period in which the temperature of the battery 40 falls within a second temperature range higher than the first temperature range, the third integrated temperature period is an integrated value of a period in which the temperature of the battery 40 falls within a third temperature range higher than the second temperature range, the fourth integrated temperature period is an integrated value of a period in which the temperature of the battery 40 falls within a fourth temperature range higher than the third temperature range, the fifth integrated temperature period is an integrated value of a period in which the temperature of the battery 40 falls within a fifth temperature range higher than the fourth temperature range, the sixth integrated temperature period is an integrated value of a period in which the temperature of the battery 40 falls within a sixth temperature range higher than the fifth temperature range, the seventh integrated temperature period is an integrated value of a period in which the temperature of the battery 40 falls within a seventh temperature range higher than the sixth temperature range, the eighth integrated temperature period is an integrated value of a period in which the temperature of the battery 40 falls within a eighth temperature range higher than the seventh temperature range, the ninth integrated temperature period is an integrated value of a period in which the temperature of the battery 40 falls within a ninth temperature range higher than the eighth temperature range, and the tenth integrated temperature period is an integrated value of a period in which the temperature of the battery 40 falls within a tenth temperature range higher than the ninth temperature range. That is, the first integrated temperature period to the tenth integrated temperature period correspond to the intermediate data 174 of the temperature of the battery 40.

The data conversion unit 120 uses the time-series data 172 of the current of the battery 40 to calculate an integrated charge current amount by integrating a charge amount of the battery 40 and calculate an integrated discharge current amount by integrating a discharge amount of the battery 40. The integrated charge current amount and the integrated discharge current amount correspond to the intermediate data 174 of the current of the battery 40. The data conversion unit 120 further calculates, as a degradation indicator of the battery 40, an SOH (State Of Health), which indicates the ratio of a full-charge capacity at the time of degradation to the initial full-charge capacity [Ah] of the battery 40 indicating 100%, by using any SOH diagnosis algorithm on the basis of the time-series data 172, and stores the calculated SOH into the storage unit 170 as the intermediate data 174.

Figure 6:
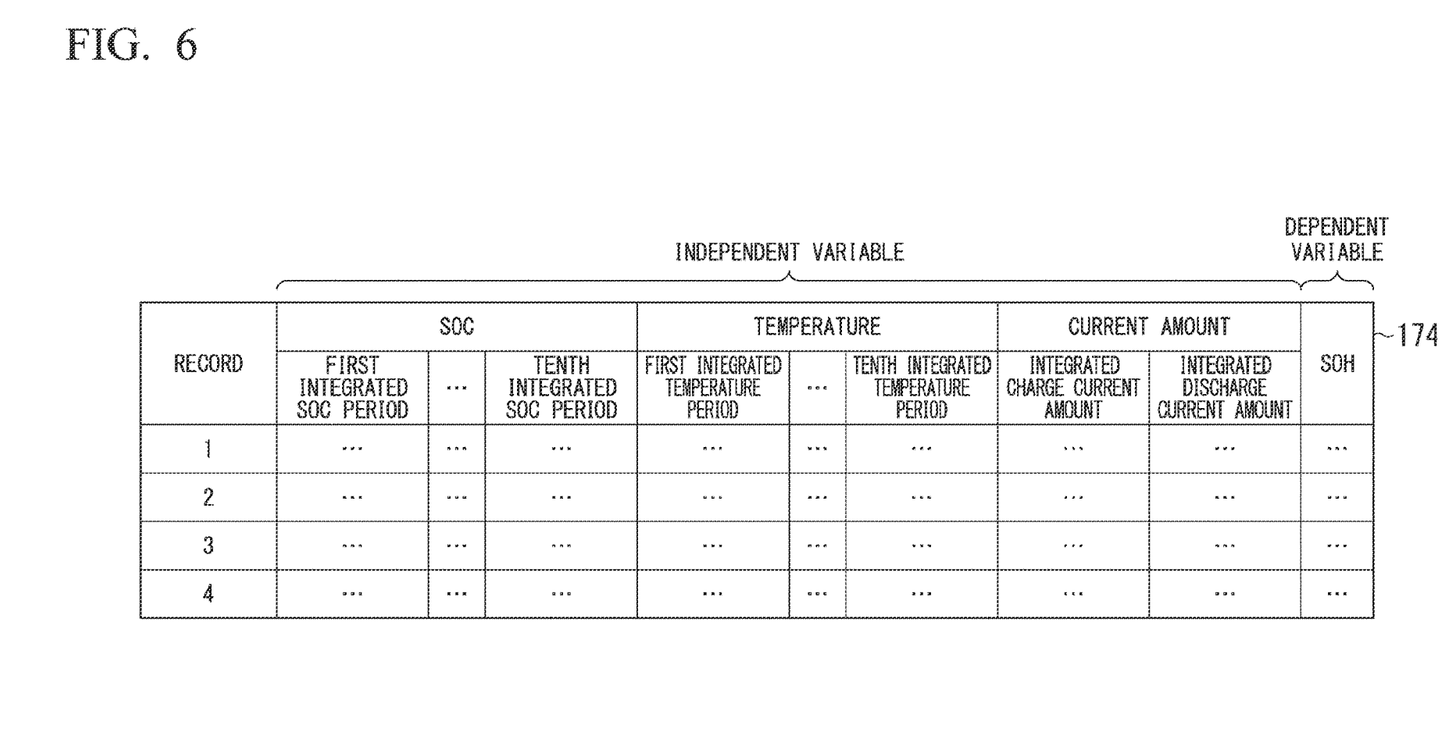
FIG. 6 is a diagram illustrating an example of the configuration of the intermediate data generated by a data conversion unit.

FIG. 6 is a diagram illustrating an example of the configuration of the intermediate data 174 generated by the data conversion unit 120. As illustrated in FIG. 6, the intermediate data 174 is data associating the first integrated SOC period to the tenth integrated SOC period, the first integrated temperature period to the tenth integrated temperature period, the integrated charge current amount, and the integrated discharge current amount, which function as independent variables of the prediction model to be trained by the prediction model training unit 140 described later, with the SOC that functions as a dependent variable. The data conversion unit 120 converts the time-series data 172 to the intermediate data 174 at an interval of one week, for example, and stores the intermediate data 174 into the storage unit 170 as one record.

In this manner, the intermediate data 174 is generated in a period since start of acquisition of the time-series data 172 by the data acquisition unit 110 until the current time point. Thus, when the prediction model is trained by using the intermediate data 174 as the training data, the estimation accuracy of the prediction model is expected to be high in the period in which the time-series data 172 is acquired, whereas the estimation accuracy is expected to deteriorate outside of this period.

Figure 7:
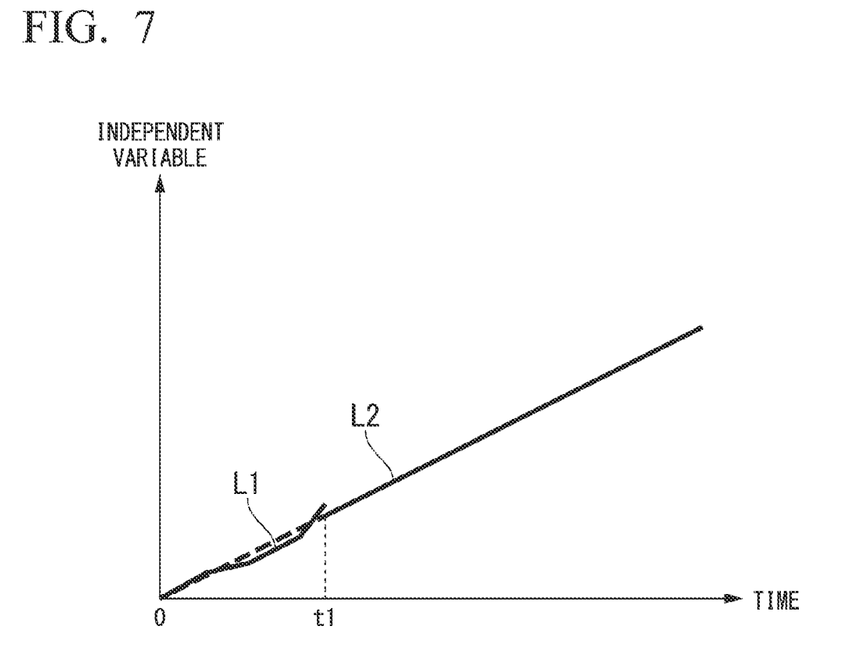
FIG. 7 is a diagram illustrating an example of a method of predicting the future value of an independent variable of the intermediate data in accordance with a prediction function.

In view of the above-mentioned circumstances, the training data generation unit 130 predicts the future values of the independent variable and dependent variable of the intermediate data 174 in accordance with the prediction function, and generates the training data 176. FIG. 7 is a diagram illustrating an example of a method of predicting the future value of an independent variable of the intermediate data 174 in accordance with the prediction function. In FIG. 7, L1 represents transition of the value of any item among the first integrated SOC period to the tenth integrated SOC period, the first integrated temperature period to the tenth integrated temperature period, the integrated charge current amount, and the integrated discharge current amount, which are independent variables of the intermediate data 174, and t1 represents the last time point (for example, current time point) at which the data conversion unit 120 has generated the intermediate data 174. That is, FIG. 7 represents a situation in which the value of the independent variable of the intermediate data 174 is acquired in a period since the time point 0 until the time point t1.

The training data generation unit 130 predicts the future value of the independent variable on the basis of the transition L1 of the value of the independent variable of the intermediate data 174. Specifically, the training data generation unit 130 predicts the future value of the independent variable by fitting a linear function a+b×t represented by L2 to the transition L1 of the value of the independent variable. The training data generation unit 130 stores the independent variable of the intermediate data 174 into the storage unit 170 as the independent variable of the training data 176 together with the predicted future value of the independent variable.

Figure 8:
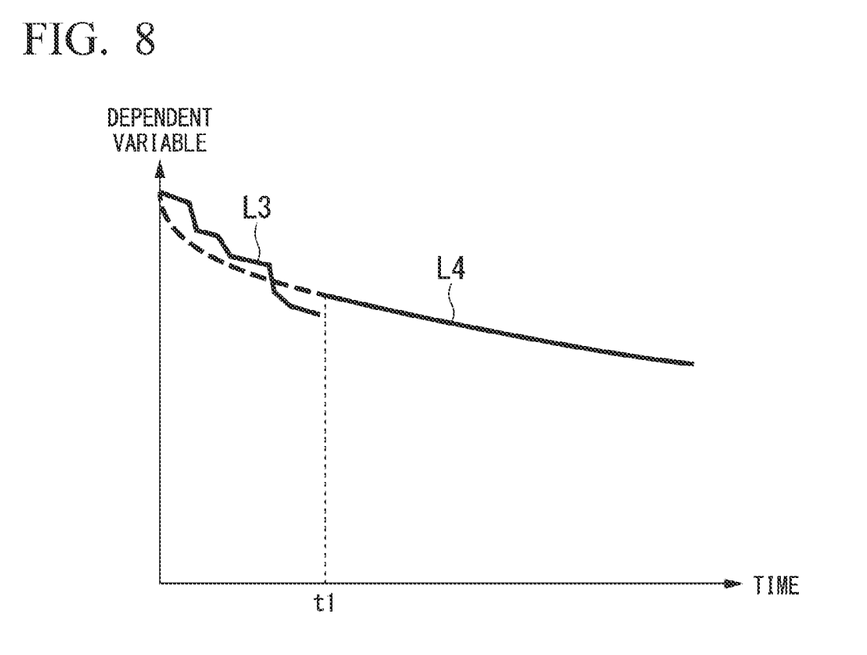
FIG. 8 is a diagram illustrating an example of a method of predicting the future value of a dependent variable of the intermediate data in accordance with a prediction function.

FIG. 8 is a diagram illustrating an example of a method of predicting the future value of a dependent variable of the intermediate data 174 in accordance with the prediction function. In FIG. 8, L3 represents transition of the value of SOH, which is a dependent variable of the intermediate data 174, and t1 represents the last time point (for example, current time point) at which the data conversion unit 120 has generated the intermediate data 174. That is, FIG. 8 represents a situation in which the value of the dependent variable of the intermediate data 174 is acquired in a period since the time point 0 until the time point t1.

The training data generation unit 130 predicts the future value of the dependent variable on the basis of the transition L3 of the value of the dependent variable of the intermediate data 174. Specifically, the training data generation unit 130 predicts the future value of the dependent variable by fitting a linear function a−b×t$^n$ (n represents any real number) including exponentiation represented by L4 to the transition L3 of the value of the dependent variable. The training data generation unit 130 stores the dependent variable of the intermediate data 174 into the storage unit 170 as the dependent variable of the training data 176 together with the predicted future value of the dependent variable. The exponent value of a power function to be fitted is searched for by the exponent value searching unit 160 described later, and the processing by the exponent value searching unit 160 is described later.

The prediction model training unit 140 trains the prediction model 178 for estimating the SOH of the battery 40 by using the training data 176 generated by the training data generation unit 130. More specifically, the prediction model training unit 140 trains the prediction model 178 using an algorithm such as generalized linear models, decision trees, and neural networks by setting the first integrated SOC period to the tenth integrated SOC period, the first integrated temperature period to the tenth integrated temperature period, the integrated charge current amount, and the integrated discharge current amount of the training data 176 as the independent variables and setting the SOH as the dependent variable. The training data 176 to be used for training by the prediction model training unit 140 is not limited to data in the period in which the time-series data 172 is acquired, but also includes data outside of this period. Therefore, the prediction model 178 trained by using the training data 176 can predict SOH in the long term.

The degradation state estimation unit 150 estimates the future SOH of the battery 40 by inputting future virtual history data (virtual history data), which depends on the battery usage condition to be predicted, to the prediction model (trained model) trained by the prediction model training unit 140. For example, the user of the battery degradation estimation device 100 inputs the future values of SOC, temperature, and current, which depend on the battery usage condition to be predicted, on an interface screen provided by the battery degradation estimation device 100, and the degradation state estimation unit 150 inputs the input future values of SOC, temperature, and current to the prediction model 178 to provide the predicted value of SOH to the user.

In the description given above, the data acquisition unit 110 acquires the time-series data 172 of SOC of the battery 40. However, the present invention is not limited to such a configuration, and the data acquisition unit 110 may acquire the time-series data 172 of voltage instead of or in addition to the SOC of the battery 40. In this case, for example, the data acquisition unit 110 extracts only the time-series data 172 in which the voltage can be regarded as OCV (open circuit voltage) (for example, when the value of current is equal to or smaller than a predetermined value, the voltage can be regarded as OCV), and interpolates the voltage value by using any algorithm such as fitting for a period in which the voltage cannot be regarded as OCV. Next, the data conversion unit 120 integrates the period in which the voltage value falls within a specific range to calculate, for example, a first integrated voltage period to a tenth integrated voltage period and generate the intermediate data 174 similarly to the case of SOC.

[Search of Exponent Value]

Figure 9:
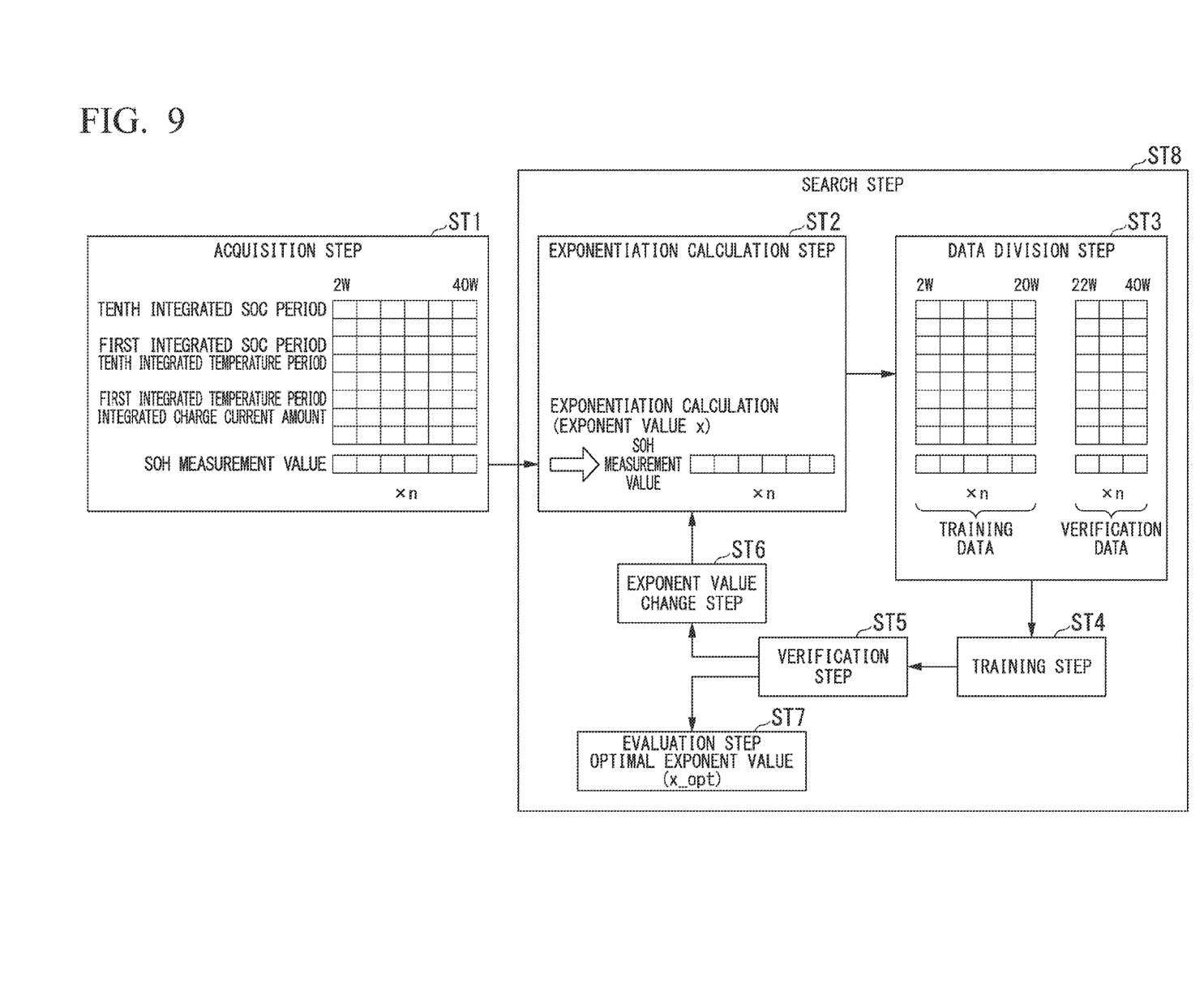
FIG. 9 is a diagram illustrating an example of a flow of an exponent value searching method to be executed by an exponent value searching unit.

Next, a description is given of an exponent value searching method to be executed by the exponent value searching unit 160. FIG. 9 is a diagram illustrating an example of a flow of the exponent value searching method to be executed by the exponent value searching unit 160.

First, in an acquisition step ST1, the exponent value searching unit 160 acquires n sets (n is an integer of 2 or more) of time-series data equivalent to a predetermined sampling period (for example, 40 weeks). The time-series data includes a plurality of usage history parameters (that is, first integrated SOC period to tenth integrated SOC period, first integrated temperature period to tenth integrated temperature period, integrated charge current amount, and integrated discharge current amount) and an SOH measurement value for a sample battery of the same type as the battery 40.

Next, in a search step ST8, an evaluation step ST7 is executed after repeatedly executing a plurality of times of an exponentiation calculation step ST2, a data division step ST3, a training step ST4, a verification step ST5, and an exponent value change step ST6. Now, the details of steps ST2 to ST7 are described in detail.

First, in the exponentiation calculation step ST2, the exponent value searching unit 160 subjects the plurality of SOH measurement values acquired in the acquisition step ST1 to exponentiation by a predetermined exponent value x to generate time-series data of a plurality of output parameters. The initial value of the exponent value x is set to any real value (for example, 0.5) within the range of 0 to 1.

Next, in the data division step ST3, the exponent value searching unit 160 defines, as training data, time-series data that belongs to a training period (for example, second week to twentieth week) among pieces of time-series data of the SOH measurement value and usage history parameters equivalent to the sampling period, which are generated through the above-mentioned steps ST1 and ST2, and defines time-series data that belongs to a verification period (for example, 22nd week to 40th week) after this training period as verification data.

Next, in the training step ST4, the exponent value searching unit 160 trains a linear regression model that sets a plurality of usage history parameters as independent variables and an SOH prediction value as a dependent variable by using the training data defined in the above-mentioned step ST3 to construct a battery model, and stores this battery model into the storage medium in association with the exponent value set in the step ST2.

Next, in the verification step ST5, the exponent value searching unit 160 uses the verification data defined in the step ST3 to evaluate the prediction accuracy of the trained battery model constructed in the step ST4. More specifically, the SOH prediction value, which is obtained by inputting the usage history parameters included in the verification data to the trained battery model as independent variables, and the SOH measurement value included in the verification data are compared with each other to evaluate the prediction accuracy of the trained battery model. In this embodiment, a description is given of a case in which a mean absolute error (hereinafter referred to as "MAE") between the SOH prediction value and the SOH measurement value, a root mean squared error (hereinafter referred to as "RMSE"), a coefficient of determination (hereinafter referred to as "R2"), and the like are set as prediction accuracy indicators of the trained battery model.

Next, in the exponent value change step ST6, the exponent value searching unit 160 changes the exponent value x defined in the exponentiation calculation step ST2 to a value that falls within the range of 0 to 1 and is different from past set values, and returns to the exponentiation calculation step ST2.

In the search step ST8, the processing of steps ST2 to ST6 is executed a plurality of number of times while changing the exponent value x as described above, to thereby be able to obtain a plurality of exponent values x, a plurality of trained battery models associated with the plurality of exponent values x, and a prediction accuracy indicator for each trained battery model.

In the evaluation step ST7, the exponent value searching unit 160 searches for an optimal exponent value x_opt for the exponent value x on the basis of the plurality of prediction accuracy indicators calculated in the steps ST2 to ST6. More specifically, in the evaluation step ST7, the exponent value searching unit 160 determines the trained battery model having the highest prediction accuracy on the basis of the result of calculating the prediction accuracy indicator, and determines, as the optimal exponent value x_opt, the exponent value x associated with the trained battery model. In this manner, it is possible to improve the accuracy of the prediction model 178 by searching for the optimal exponent value that depends on the characteristics of an individual battery.

Figure 10:
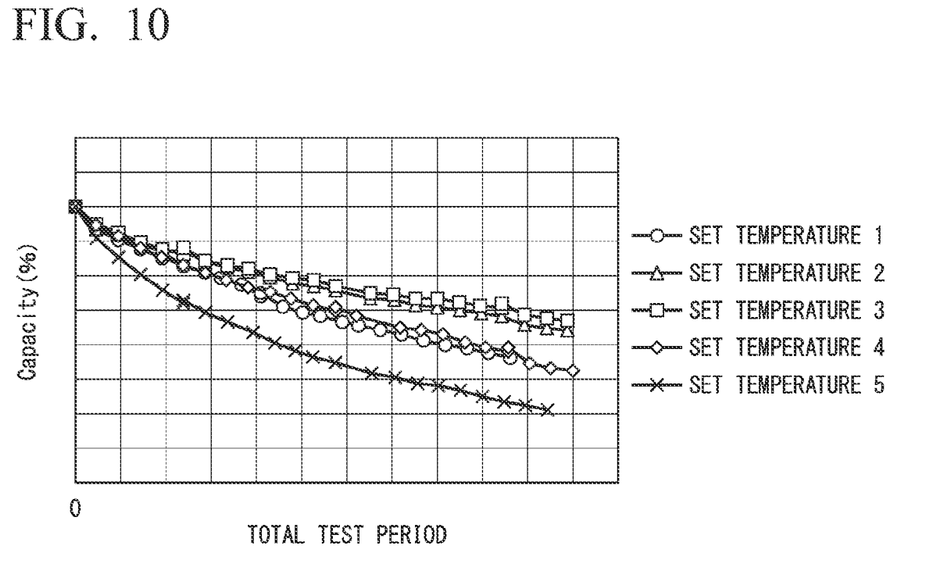
FIG. 10 is a diagram for describing an outline of an exponent value experimental searching method.

In the above, a description has been given of an example of the exponent value searching unit 160 searching for the exponent value by using a linear regression model. However, the present invention is not limited to such a configuration. For example, the exponent value searching unit 160 may collect SOH data as measurement data from an actually traveling vehicle (there may be one or a plurality of actually traveling vehicles), and search for the exponent value by calculating a function including exponentiation to be fitted to the data. Further, for example, the exponent value searching unit 160 may search for the exponent value by causing the battery 40 to charge/discharge electricity through experiment, measuring the SOH value, and calculating a function including exponentiation to be fitted to the data. When searching for the exponent value using market data, the acquired exponent value may have an error due to difference in condition such as the temperature of the battery 40 for each piece of data. On the other hand, when searching for the exponent value through experiment, it is possible to acquire a more accurate exponent value by setting the condition such as the temperature to be constant and measuring the SOH value FIG. 10 is a diagram for describing an outline of the exponent value experimental searching method. As illustrated in FIG. 10, first, the SOH value that changes depending on charge/discharge of the battery 40 is measured for each of a plurality of set temperatures. Next, a function including exponentiation is fitted to the SOH value measured for each of a plurality of set temperatures to calculate an exponent value for each of the plurality of set temperatures. Next, an optimal exponent value is acquired by calculating an average of the calculated exponent values. Either one of the fitting error or the coefficient of determination may be used for evaluation of fitting in the actual measurement technique and experiment technique described above.

According to this embodiment described above, the battery degradation estimation device converts the time-series data of the battery to the intermediate data to be used for training, generates training data by predicting the future values of the independent variable and dependent variable of the intermediate data in accordance with the prediction function, and trains the prediction model for predicting an indicator relating to the degradation state of the battery on the basis of the generated training data. As a result, it is possible to predict long-term SOH without the need to prepare long-term training data.

The above-mentioned embodiment can be represented in the following way.

A battery degradation estimation device including a storage medium that stores computer-readable instructions, and a processor coupled to the storage medium, the processor executing the computer-readable instructions to:
acquire time-series data including at least a voltage, SOC (State Of Charge), temperature, and current of a battery;
convert the time-series data into intermediate data to be used for training;
predict a future value of the intermediate data and a future value of an indicator relating to a degradation state of the battery by using a prediction function to generate training data;
train a prediction model for estimating the indicator relating to the degradation state of the battery on the basis of the training data; and
estimate the indicator relating to the degradation state of the battery on the basis of the prediction model.

This concludes the description of the embodiment for carrying out the present invention. The present invention is not limited to the embodiment in any manner, and various kinds of modifications and replacements can be made within a range that does not depart from the gist of the present invention. For example, the present invention can be applied to power conversion equipment and grids, which can be connected to commercial power systems.

What is claimed is:

1. A battery degradation estimation device comprising a storage medium that stores computer-readable instructions, and a processor coupled to the storage medium, the processor executing the computer-readable instructions to:
acquire time-series data including at least a voltage, SOC (State Of Charge), temperature, and current of a battery;
convert the time-series data into intermediate data to be used for training;
predict a future value of the intermediate data and a future value of an indicator relating to a degradation state of the battery by using a prediction function to generate training data;
train a prediction model for estimating the indicator relating to the degradation state of the battery on the basis of the training data;
estimate the indicator relating to the degradation state of the battery on the basis of the prediction model,
wherein the processor calculates the future value of the intermediate data by using a linear function, which is a first prediction function of prediction functions, and calculates the future value of the indicator relating to the degradation state by using a function including exponentiation, which is a second prediction function of the prediction functions, to thereby generate the training data based on the future value in addition to the training data based on the time-series data; and
based on the indicator, cause an electric motor of a mobile object to drive the mobile object in a traveling direction.

2. The battery degradation estimation device according to claim 1,
wherein the intermediate data includes, as an independent variable of the prediction model, at least one of:
integrated voltage distribution information obtained by integrating a period in which the battery has exhibited a predetermined voltage value;
integrated SOC distribution information obtained by integrating a period in which the battery has exhibited a predetermined SOC value;
integrated temperature distribution information obtained by integrating a period in which the battery has exhibited a predetermined temperature value;
an integrated charge current amount obtained by integrating a charge amount of the battery; and
an integrated discharge current amount obtained by integrating a discharge amount of the battery; and
wherein the processor generate the training data by increasing a data amount of the at least one independent variable by using a linear function.

3. The battery degradation estimation device according to claim 2,
wherein a dependent variable of the prediction model is an indicator relating to the degradation state of the battery, and
wherein the processor generates the training data by increasing a data amount of the dependent variable using a function including exponentiation.

4. The battery degradation estimation device according to claim 3, wherein the processor repeats steps of subjecting a measurement value of the dependent variable to exponentiation calculation while changing an exponent value of the function including exponentiation, training a battery model for estimating the measurement value of the dependent variable subjected to the exponentiation calculation with the intermediate data serving as an independent variable, and evaluating an output value of the trained battery model, to thereby search for an optimal exponent value of the function including exponentiation.

5. The battery degradation estimation device according to claim 2, wherein the processor is capable of detecting the stopped state of a device using power in which the battery is mounted, and interpolates the time-series data of the device in the stopped state.

6. A battery degradation estimation system comprising:
a plurality of devices using power comprising:
  a battery that provides time-series data including at least one of a voltage, SOC (State Of Charge), temperature, and current of the battery; and
a management device comprising:
  a processor that executes instructions to:
  acquire the time-series data from the battery;
  convert the time-series data into intermediate data to be used for training;
  predict a future value of the intermediate data and a future value of an indicator relating to a degradation state of the battery by using a prediction function to generate training data;
  train a prediction model for estimating the indicator relating to the degradation state of the battery on the basis of the training data;
  estimate the indicator relating to the degradation state of the battery on the basis of the prediction model;
  calculate the future value of the intermediate data by using a linear function, which is a first prediction function of prediction functions, and calculate the future value of the indicator relating to the degradation state by using a function including exponentiation, which is a second prediction function of the prediction functions, to thereby generate the training data based on the future value in addition to the training data based on the time-series data; and
  based on the indicator, cause an electric motor of a mobile object to drive the mobile object in a traveling direction.

7. A battery degradation estimation method to be executed by a computer, the battery degradation estimation method comprising:
  acquiring time-series data including at least a voltage, SOC (State Of Charge), temperature, and current of a battery;
  converting the time-series data into intermediate data to be used for training;
  predicting a future value of the intermediate data and a future value of an indicator relating to a degradation state of the battery by using a prediction function to generate training data;
  training a prediction model for estimating the indicator relating to the degradation state of the battery on the basis of the training data;
  estimating the indicator relating to the degradation state of the battery on the basis of the prediction model,
  calculating the future value of the intermediate data by using a linear function, which is a first prediction function of prediction functions, and calculating the future value of the indicator relating to the degradation state by using a function including exponentiation, which is a second prediction function of the prediction functions, thereby generating the training data based on the future value in addition to the training data based on the time-series data; and
  based on the indicator, causing an electric motor of a mobile object to drive the mobile object in a traveling direction.

8. A non-transitory computer-readable storage medium having stored thereon a program for causing a computer to:
  acquire time-series data including at least a voltage, SOC (State Of Charge), temperature, and current of a battery;
  convert the time-series data into intermediate data to be used for training;
  predict a future value of the intermediate data and a future value of an indicator relating to a degradation state of the battery by using a prediction function to generate training data;
  train a prediction model for estimating the indicator relating to the degradation state of the battery on the basis of the training data;
  estimate the indicator relating to the degradation state of the battery on the basis of the prediction model,
  calculate the future value of the intermediate data by using a linear function, which is a first prediction function of prediction functions, and calculate the future value of the indicator relating to the degradation state by using a function including exponentiation, which is a second prediction function of the prediction functions, to thereby generate the training data based on the future value in addition to the training data based on the time-series data; and
  based on the indicator, cause an electric motor of a mobile object to drive the mobile object in a traveling direction.

* * * * *